(12) United States Patent
Lv

(10) Patent No.: US 9,553,115 B1
(45) Date of Patent: Jan. 24, 2017

(54) MANUFACTURING METHOD OF TFT SUBSTRATE STRUCTURE

(71) Applicant: Shenzhen China Star Optoelectronics Technology Co., Ltd., Shenzhen (CN)

(72) Inventor: Xiaowen Lv, Shenzhen (CN)

(73) Assignee: SHENZHEN CHINA STAR OPTOELECTRONICS TECHNOLOGY CO., LTD., Shenzhen, Guangdong (CN)

( * ) Notice: Subject to any disclaimer, the term of this patent is extended or adjusted under 35 U.S.C. 154(b) by 0 days.

(21) Appl. No.: 14/778,083

(22) PCT Filed: Jul. 27, 2015

(86) PCT No.: PCT/CN2015/085161
§ 371 (c)(1),
(2) Date: Sep. 18, 2015

(51) Int. Cl.
*H01L 27/12* (2006.01)
*H01L 29/66* (2006.01)

(52) U.S. Cl.
CPC ....... *H01L 27/1262* (2013.01); *H01L 27/1225* (2013.01); *H01L 29/66969* (2013.01)

(58) Field of Classification Search
CPC combination set(s) only.
See application file for complete search history.

(56) References Cited

U.S. PATENT DOCUMENTS

| | | | | |
|---|---|---|---|---|
| 9,472,677 B2 * | 10/2016 | Yamazaki | ........... | H01L 29/7869 |
| 2010/0006847 A1 * | 1/2010 | Hu | ................... | H01L 29/78621 257/66 |
| 2011/0084267 A1 * | 4/2011 | Yamazaki | ......... | H01L 21/76828 257/43 |
| 2013/0264564 A1 * | 10/2013 | Park | .................... | H01L 29/7869 257/43 |
| 2014/0159034 A1 * | 6/2014 | Yang | ................... | H01L 27/1296 257/43 |
| 2015/0221675 A1 * | 8/2015 | Yasukawa | ............. | G02F 1/1368 438/22 |
| 2016/0306220 A1 * | 10/2016 | Zhang | ............... | G02F 1/133345 |
| 2016/0306247 A1 * | 10/2016 | Ito | .................... | G02F 1/136286 |

\* cited by examiner

*Primary Examiner* — Mamadou Diallo
(74) *Attorney, Agent, or Firm* — Leong C. Lei

(57) ABSTRACT

The present invention provides a manufacturing method of a TFT substrate structure, which includes sequentially forming a first passivation layer, a planarization layer, and a first transparent conductive film and then first subjecting the first transparent conductive film to patterning to form a first pixel electrode and thereafter, a photolithographic process is applied to the planarization layer for exposure and thus forming a first via located above and corresponding to a drain terminal, followed by using the planarization layer as a self-aligning mask to apply dry etching to the first passivation layer for etching to form a second via that corresponds to the first via, whereby residues of the first transparent conductive film in the first and second vias can be effectively prevented and product yield is enhanced. Further, on mask can be saved to prevent reduction of aperture ratio caused by misalignment thereby improving the production efficiency, reducing production cost, and increasing cost-related competition power of products.

16 Claims, 9 Drawing Sheets

MANUFACTURING METHOD OF TFT SUBSTRATE STRUCTURE

BACKGROUND OF THE INVENTION

1. Field of the Invention

The present invention relates to the field of display technology, and in particular to a manufacturing method of a thin-film-transistor (TFT) substrate structure.

2. The Related Arts

A liquid crystal display (LCD) comprises an enclosure, a liquid crystal panel arranged in the enclosure, and a backlight module mounted in the enclosure. The liquid crystal panel is generally composed of a color filter (CF) substrate, a thin-film transistor (TFT) array substrate, and a liquid crystal layer filled between the two substrates. The CF substrate and the TFT substrate have inner surfaces facing each other and provided with transparent electrodes. The liquid crystal display is operated by providing an electric field to control the direction of liquid crystal molecules in order to change the state of polarization, and polarizers are involved to selectively to allow an optic path to pass or be blocked to thereby achieve the purpose of displaying.

The fringe field switching (FFS) technology is one of the techniques that have bee recently developed for improve image quality of LCDs and satisfies the requirements for both high transmittance and large view angle. FIG. 1 is a schematic view, in a sectioned form, showing a conventional TFT substrate of an FFS liquid crystal display panel, which comprises a base plate 100, a buffer layer 200 formed on the base plate 100, a gate terminal 300 formed on the buffer layer 200, a gate insulation layer 400 formed on the buffer layer 200 and covering the gate terminal 300, an island-like conductor layer 500 formed on the gate insulation layer 400, a source terminal 600 a the drain terminal 700 formed on the gate insulation layer 400 and respectively in contact with two side portions of the island-like conductor layer 500, a first passivation layer 800 formed on the gate insulation layer 400, the island-like semiconductor layer 500, the source terminal 600, and the drain terminal 700, a planarization layer 900 formed on the first passivation layer 800, a first pixel electrode 1000 formed on the planarization layer 900, a second passivation layer 1100 formed on the planarization layer 900 and the first pixel electrode 1000, and a second pixel electrode 1200 formed on the second passivation layer 1100. A via 1300 is formed in the second passivation layer 1100, the planarization layer 900, and the first passivation layer 800 to be located above and correspond to the drain terminal 700. The second pixel electrode 1200 is set in contact with the drain terminal 700 through the via 1300.

Referring to FIGS. 2-9, a known method for manufacturing the TFT substrate structure of the FFS liquid crystal display panel comprises the following steps:

Step 1: as shown in FIG. 2, providing a base plate 100 and depositing a buffer layer 200 on the base plate 100 and depositing a first metal layer on the buffer layer 200 and subjecting the first metal layer to patterning to form a gate terminal 300;

Step 2: as shown in FIG. 3, depositing a gate insulation layer 400 on the buffer layer 200 and the gate terminal 300 and depositing an oxide semiconductor layer on the gate insulation layer 400 and subjecting the oxide semiconductor layer to patterning to form an island-like semiconductor layer 500;

Step 3: as shown in FIG. 4, depositing a second metal layer on the gate insulation layer 400 and the island-like semiconductor layer 500 and subjecting the second metal layer to patterning to form a source terminal 600 and a drain terminal 700;

Step 4: as shown in FIG. 5, depositing a first passivation layer 800 on the gate insulation layer 400, the island-like semiconductor layer 500, the source terminal 600, and the drain terminal 700 and forming a first via 810 in the first passivation layer 800 to be located above and correspond to the drain terminal 700;

Step 5: as shown in FIG. 6, forming a planarization layer 900 on the first passivation layer 800 and forming a second via 901 in the planarization layer 900 to be located above and correspond to the first via 810;

Step 6: as shown in FIG. 7, depositing a first transparent conductive film on the planarization layer 900 and coating a photoresist layer 1101 on the first transparent conductive film, wherein since the first and second vias 810, 910 are of a great depth, the photoresist layer 1101 may easily accumulate in the first and second vias 810, 910;

Step 7: as shown in FIG. 8, subjecting the photoresist layer 1101 to exposure and development, wherein specifically, during the exposure and development, the portion of the photoresist layer 1101 that accumulates within the first and second vias 810, 910 may be susceptible to incomplete development, leading to residues of the photoresist layer 1101 remaining in the first and second vias 810, 910; and Step 8: as shown in FIG. 9, with the photoresist layer 1101 as a shielding layer, subjecting a portion of the first transparent conductive film that is not shielded by the photoresist layer 1101 to etching so as to form a first pixel electrode 1000, wherein since the portion of the first transparent conductive film located in the first and second vias 810, 910 may be covered by residues of the photoresist, it may not be completely removed in the etching process and the portion of first transparent conductive film may be left in the first and second vias 810, 910 and may thus affect a subsequent operation, leading to a negative influence on the quality of the TFT substrate.

Thus, in view of the problems and shortcomings of the known method, it is desired to provide an improved TFT substrate structure manufacturing method to overcome the problems of the known techniques.

SUMMARY OF THE INVENTION

An object of the present invention is to provide a manufacturing method of a thin-film transistor (TFT) substrate structure, which effectively eliminates residues of a first transparent conductive film in vias so as to enhance product yield of TFT substrates.

To achieve the above object, the present invention provides a manufacturing method of a TFT substrate structure, which comprises the following steps:

(1) providing a base plate and depositing a buffer layer on the base plate and depositing a first metal layer on the buffer layer and subjecting the first metal layer to patterning to form a gate terminal;

(2) depositing a gate insulation layer on the buffer layer and the gate terminal and depositing an oxide semiconductor on the gate insulation layer and subjecting the oxide semiconductor to patterning to form an island-like semiconductor layer;

(3) depositing a second metal layer on the gate insulation layer and the island-like semiconductor layer and subjecting the second metal layer to patterning to form a source terminal and a drain terminal;

(4) depositing a first passivation layer on the gate insulation layer, the island-like semiconductor layer, the source terminal, and the drain terminal;

(5) forming a planarization layer on the first passivation layer;

(6) depositing a first transparent conductive film on the planarization layer and subjecting the first transparent conductive film to patterning to form a first pixel electrode;

(7) sequentially forming a first via and a second via in the first passivation layer and the planarization layer to be located above and correspond to the drain terminal, wherein the first via and the second via expose a portion of the drain terminal;

(8) depositing a second passivation layer on the first pixel electrode and the planarization layer and subjecting the second passivation layer to patterning to form a third via in the second passivation layer to correspond to the first via and the second via; and (9) depositing a second transparent conductive film on the second passivation layer and subjecting the second transparent conductive film to patterning to form a second pixel electrode, wherein the second pixel electrode is connected, through the first, second, and third vias to the drain terminal.

The oxide semiconductor comprises a material of indium gallium zinc oxide (IGZO).

In step (4), chemical vapor deposition is adopted to deposit the first passivation layer.

In step (5), coating is adopted to form the planarization layer and the planarization layer is formed of perfluoroalkoxy alkane (PFA).

In step (6), physical vapor deposition is adopted to deposit the first transparent conductive film and wet etching is applied to form the first pixel electrode.

In step (7), a photolithographic process is first applied to the planarization layer for exposure to form a first via located above and corresponding to the drain terminal and then, with the planarization layer serving as a self-aligning mask, dry etching is applied to the first passivation layer for etching to form a second via corresponding to the first via.

The gate terminal comprises a material of one of molybdenum, titanium, aluminum, and copper or a stacked combination of multiple ones thereof.

The source terminal and the drain terminal comprise a material of one of molybdenum, titanium, aluminum, and copper or a stacked combination of multiple ones thereof.

The gate insulation layer, the first passivation layer, and the second passivation layer each comprise a material of silicon oxide, silicon nitride, or a stacked combination thereof.

The first pixel electrode and the second pixel electrode are formed of a material of indium tin oxide (ITO).

The present invention also provides a manufacturing method of a TFT substrate structure, which comprises the following steps:

(1) providing a base plate and depositing a buffer layer on the base plate and depositing a first metal layer on the buffer layer and subjecting the first metal layer to patterning to form a gate terminal;

(2) depositing a gate insulation layer on the buffer layer and the gate terminal and depositing an oxide semiconductor on the gate insulation layer and subjecting the oxide semiconductor to patterning to form an island-like semiconductor layer;

(3) depositing a second metal layer on the gate insulation layer and the island-like semiconductor layer and subjecting the second metal layer to patterning to form a source terminal and a drain terminal;

(4) depositing a first passivation layer on the gate insulation layer, the island-like semiconductor layer, the source terminal, and the drain terminal;

(5) forming a planarization layer on the first passivation layer;

(6) depositing a first transparent conductive film on the planarization layer and subjecting the first transparent conductive film to patterning to form a first pixel electrode;

(7) sequentially forming a first via and a second via in the first passivation layer and the planarization layer to be located above and correspond to the drain terminal, wherein the first via and the second via expose a portion of the drain terminal;

(8) depositing a second passivation layer on the first pixel electrode and the planarization layer and subjecting the second passivation layer to patterning to form a third via in the second passivation layer to correspond to the first via and the second via; and (9) depositing a second transparent conductive film on the second passivation layer and subjecting the second transparent conductive film to patterning to form a second pixel electrode, wherein the second pixel electrode is connected, through the first, second, and third vias to the drain terminal;

wherein in step (4), chemical vapor deposition is adopted to deposit the first passivation layer;

wherein in step (5), coating is adopted to form the planarization layer and the planarization layer is formed of perfluoroalkoxy alkane (PFA);

wherein in step (6), physical vapor deposition is adopted to deposit the first transparent conductive film and wet etching is applied to form the first pixel electrode; and wherein in step (7), a photolithographic process is first applied to the planarization layer for exposure to form a first via located above and corresponding to the drain terminal and then, with the planarization layer serving as a self-aligning mask, dry etching is applied to the first passivation layer for etching to form a second via corresponding to the first via.

The efficacy of the present invention is that the present invention provides a manufacturing method of a TFT substrate structure, which comprises sequentially forming a first passivation layer, a planarization layer, and a first transparent conductive film and then first subjecting the first transparent conductive film to patterning to form a first pixel electrode and thereafter, a photolithographic process is applied to the planarization layer for exposure and thus forming a first via located above and corresponding to a drain terminal, followed by using the planarization layer as a self-aligning mask to apply dry etching to the first passivation layer for etching to form a second via that corresponds to the first via, whereby residues of the first transparent conductive film in the first and second vias can be effectively prevented and product yield is enhanced. Further, on mask can be saved to prevent reduction of aperture ratio caused by misalignment thereby improving the production efficiency, reducing production cost, and increasing cost-related competition power of products.

BRIEF DESCRIPTION OF THE DRAWINGS

The features and technical contents of the present invention will be apparent from the following detailed description of the present invention and the attached drawing; however, these drawings are provided for reference and illustration and are not intended to limit the scope of the present invention. In the drawing.

DETAILED DESCRIPTION OF THE PREFERRED EMBODIMENTS

To further expound the technical solution adopted in the present invention and the advantages thereof, a detailed description is given to a preferred embodiment of the present invention and the attached drawings.

Figure 1:
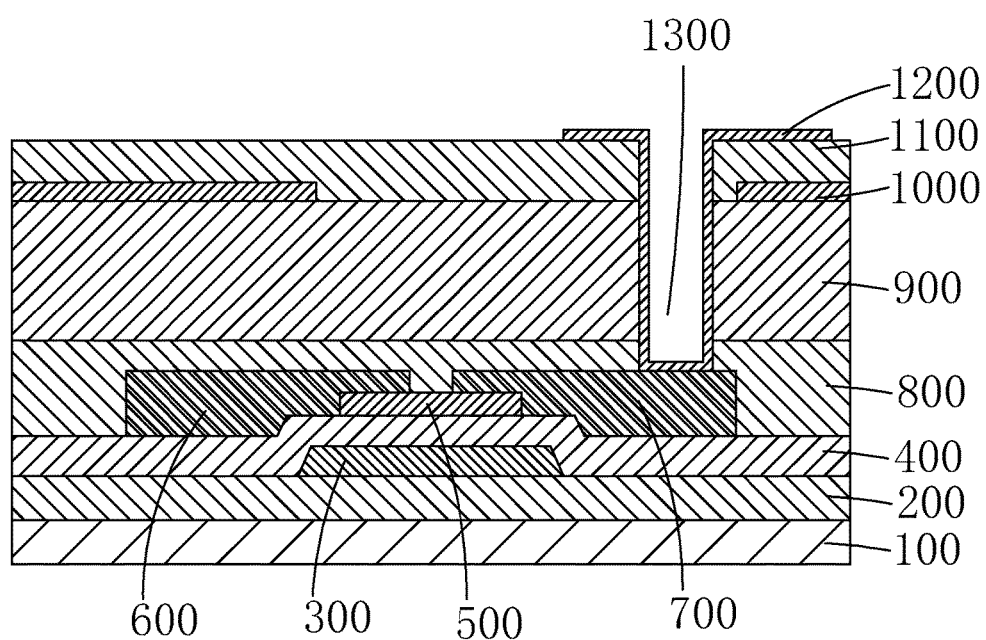
FIG. 1 is a schematic view, in a sectioned form, showing a conventional thin-film transistor (TFT) substrate structure.
Figure 2:
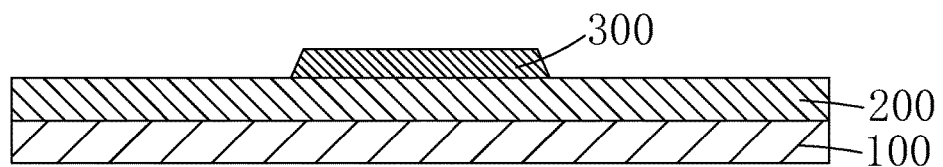
FIG. 2 is a schematic view illustrating a first step of a manufacturing method of the conventional TFT substrate structure.
Figure 3:
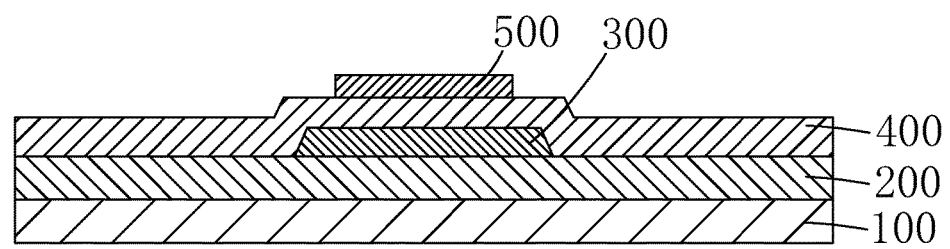
FIG. 3 is a schematic view illustrating a second step of the manufacturing method of the conventional TFT substrate structure.
Figure 4:
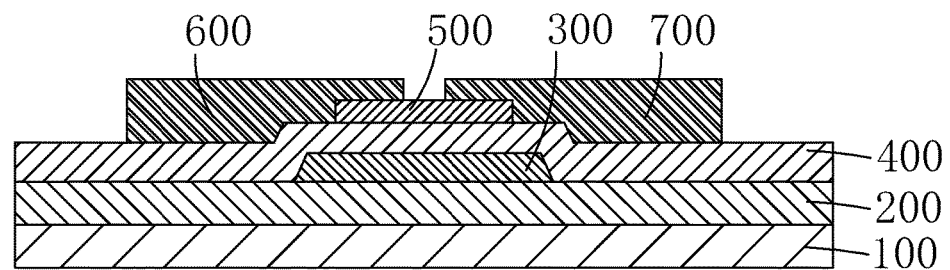
FIG. 4 is a schematic view illustrating a third step of the manufacturing method of the conventional TFT substrate structure.
Figure 5:
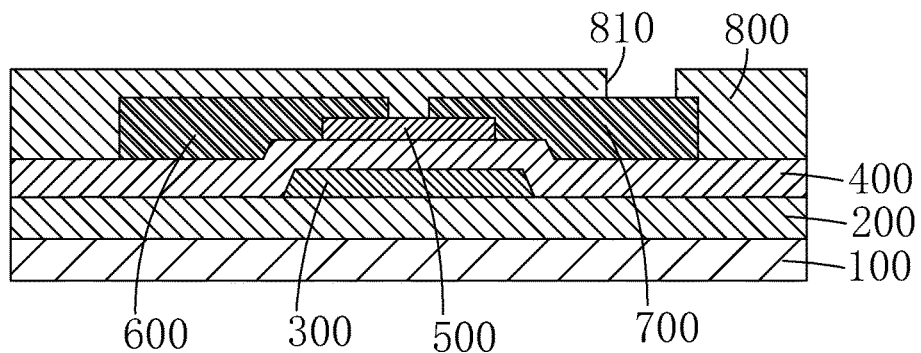
FIG. 5 is a schematic view illustrating a fourth step of the manufacturing method of the conventional TFT substrate structure.
Figure 6:
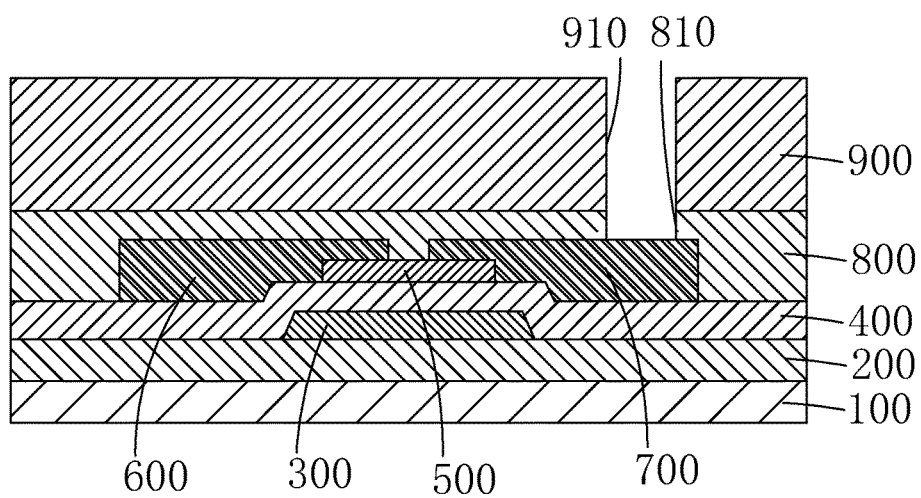
FIG. 6 is a schematic view illustrating a fifth step of the manufacturing method of the conventional TFT substrate structure.
Figure 7:
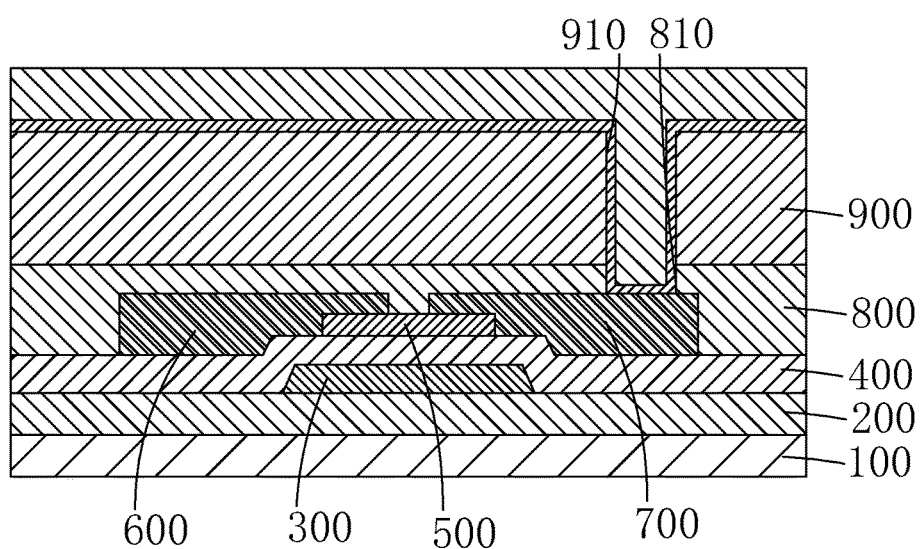
FIG. 7 is a schematic view illustrating a sixth step of the manufacturing method of the conventional TFT substrate structure.
Figure 8:
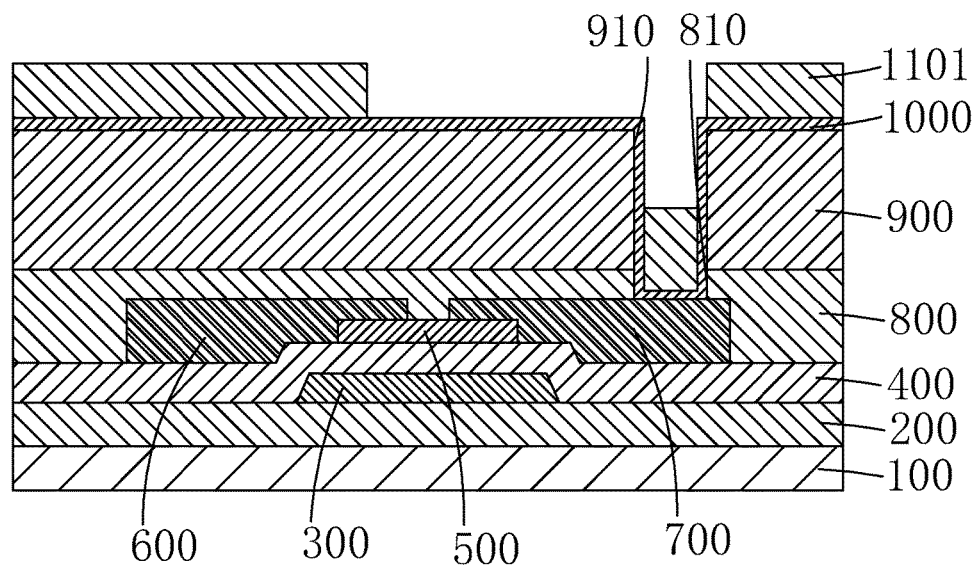
FIG. 8 is a schematic view illustrating a seventh step of the manufacturing method of the conventional TFT substrate structure.
Figure 9:
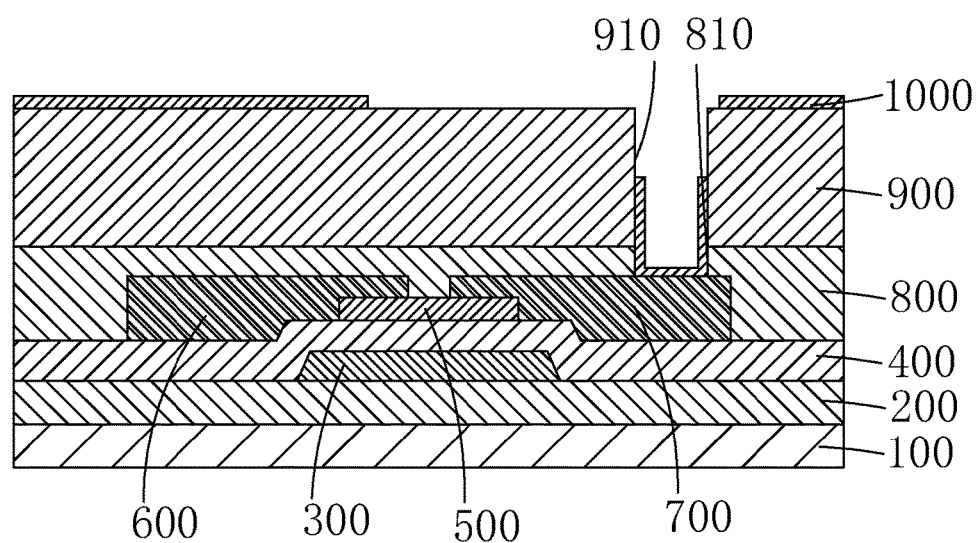
FIG. 9 is a schematic view illustrating an eighth step of the manufacturing method of the conventional TFT substrate structure.
Figure 10:
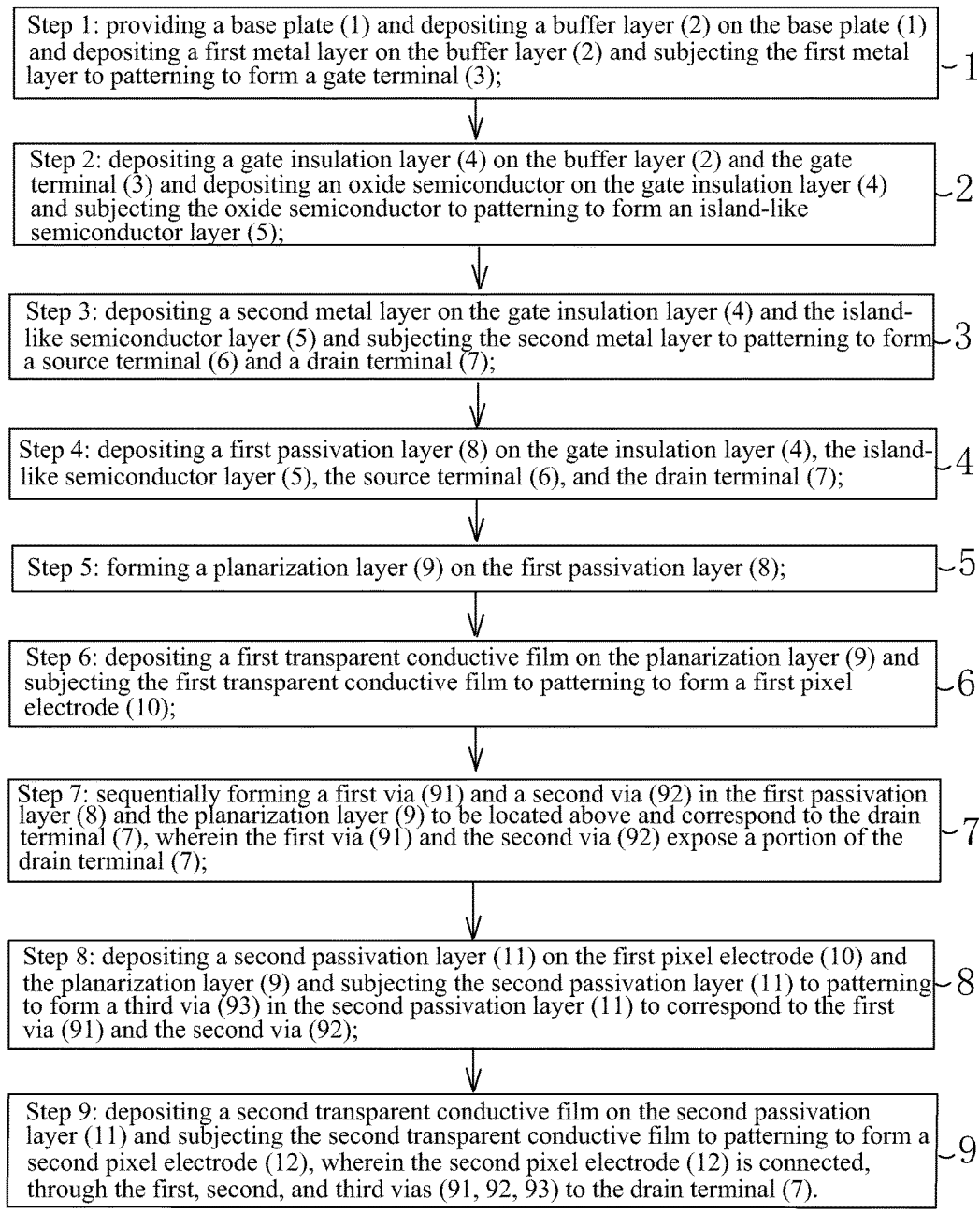
FIG. 10 is a flow chart illustrating a manufacturing method of a TFT substrate structure according to the present invention.
Figure 11:
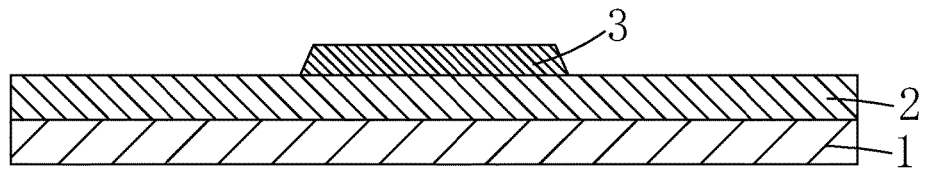
FIG. 11 is a schematic view illustrating a first step of the manufacturing method of the TFT substrate structure according to the present invention.

Referring to FIG. 10, the present invention provides a manufacturing method of a thin-film transistor (TFT) substrate structure, which comprises the following steps:

Step 1: as shown in FIG. 11, providing a base plate 1 and depositing a buffer layer 2 on the base plate 1 and depositing a first metal layer on the buffer layer 2 and subjecting the first metal layer to patterning to form a gate terminal 3.

Preferably, the gate terminal 3 comprises a material of one of molybdenum, titanium, aluminum, and copper or a stacked combination of multiple ones thereof.

Figure 12:
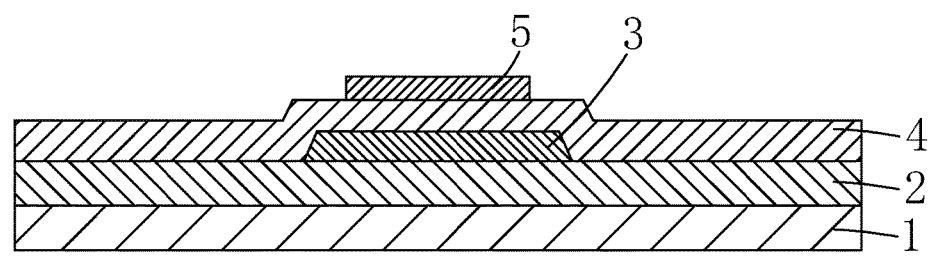
FIG. 12 is a schematic view illustrating a second step of the manufacturing method of the TFT substrate structure according to the present invention.

Step 2: as shown in FIG. 12, depositing a gate insulation layer 4 on the buffer layer 2 and the gate terminal 3 and depositing an oxide semiconductor on the gate insulation layer 4 and subjecting the oxide semiconductor to patterning to form an island-like semiconductor layer 5.

Preferably, the gate insulation layer 4 comprises a material of silicon oxide, silicon nitride, or a stacked combination thereof.

Specifically, the island-like semiconductor layer 5 comprises a material of IGZO (Indium Gallium Zinc Oxide).

Figure 13:
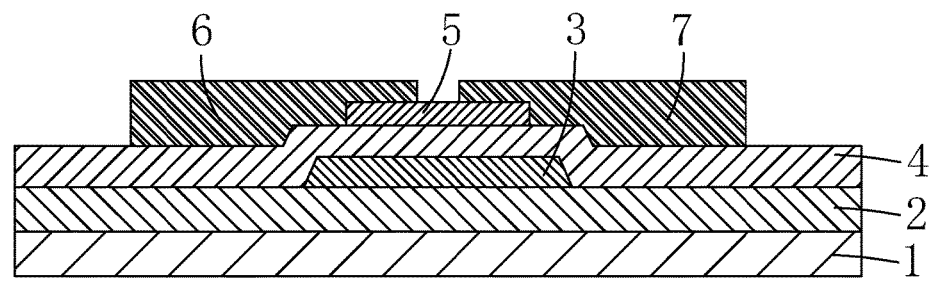
FIG. 13 is a schematic view illustrating a third step of the manufacturing method of the TFT substrate structure according to the present invention.

Step 3: as shown in FIG. 13, depositing a second metal layer on the gate insulation layer 4 and the island-like semiconductor layer 5 and subjecting the second metal layer to patterning to form a source terminal 6 and a drain terminal 7, wherein the source terminal 6, and the drain terminal 7 are respectively in contact with two side portions of the island-like semiconductor layer 5.

Preferably, the source terminal 6 and the drain terminal 7 comprise a material of one of molybdenum, titanium, aluminum, and copper or a stacked combination of multiple ones thereof.

Figure 14:
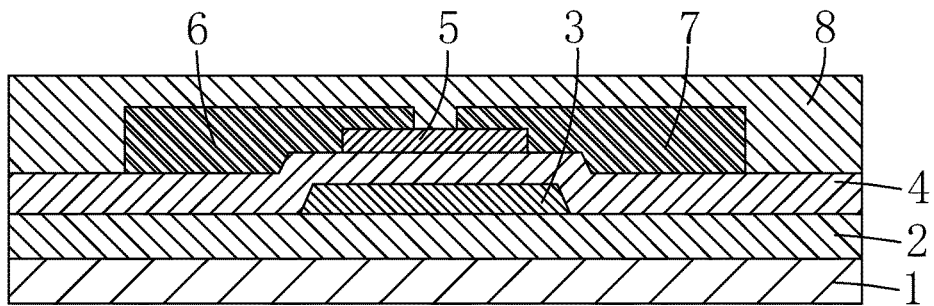
FIG. 14 is a schematic view illustrating a fourth step of the manufacturing method of the TFT substrate structure according to the present invention.

Step 4: as shown in FIG. 14, depositing a first passivation layer 8 on the gate insulation layer 4, the island-like semiconductor layer 5, the source terminal 6, and the drain terminal 7.

Specifically, chemical vapor deposition (CVD) is adopted to deposit the first passivation layer 8.

Preferably, the first passivation layer 8 comprises a material of silicon oxide, silicon nitride, or a stacked combination thereof.

Figure 15:
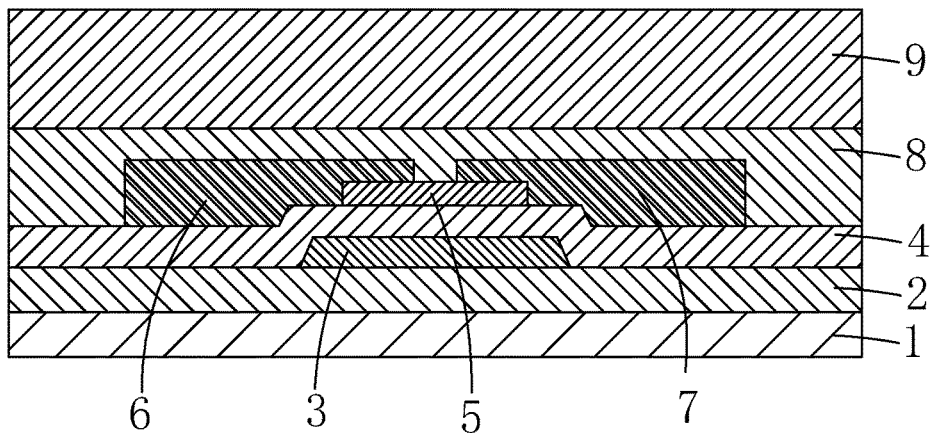
FIG. 15 is a schematic view illustrating a fifth step of the manufacturing method of the TFT substrate structure according to the present invention.

Step 5: as shown in FIG. 15, forming a planarization layer 9 on the first passivation layer 8.

Specifically, coating is adopted to form the planarization layer 9 and the planarization layer 9 is formed of a material of PFA (Perfluoroalkoxy Alkane).

Figure 16:
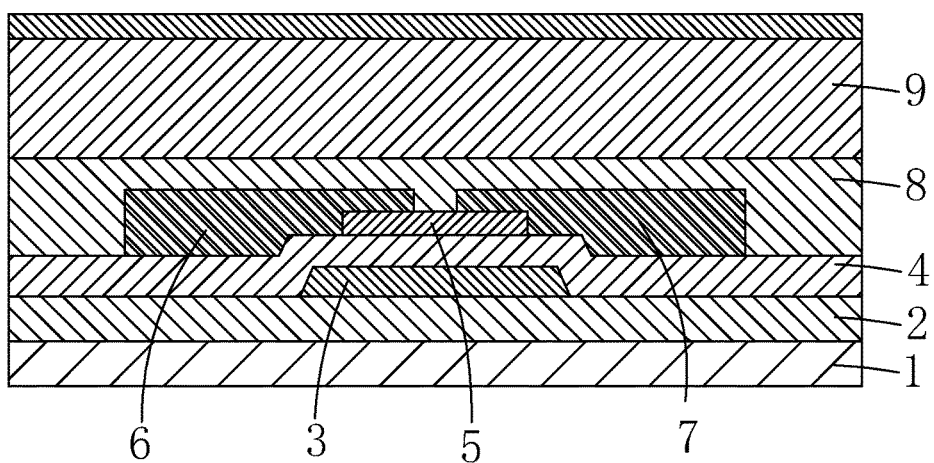
FIGS. 16 and 17 are a schematic views illustrating a sixth step of the manufacturing method of the TFT substrate structure according to the present invention.
Figure 17:
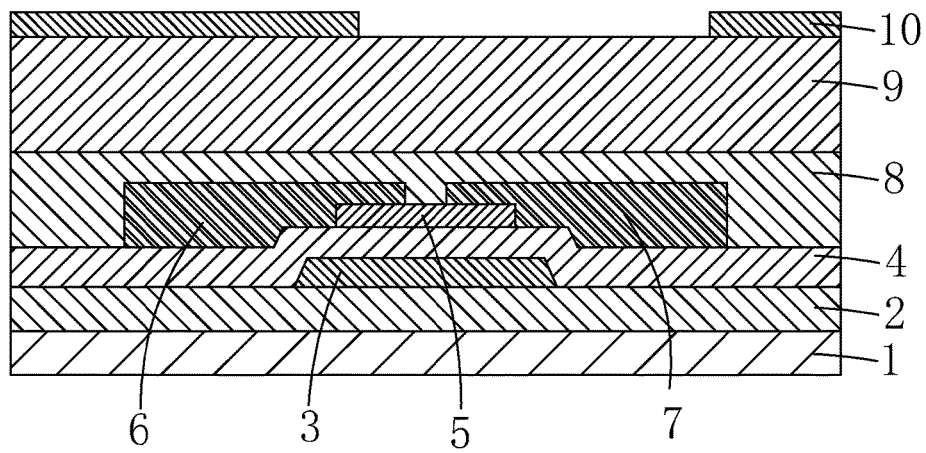

Step 6: as shown in FIGS. 16 and 17, depositing a first transparent conductive film on the planarization layer 9 and subjecting the first transparent conductive film to patterning to form a first pixel electrode 10.

Specifically, physical vapor deposition (PVD) is adopted to deposit the first transparent conductive film and wet etching is applied to form the first pixel electrode 10; the first pixel electrode 10 comprises a material of indium tin oxide (ITO).

Figure 18:
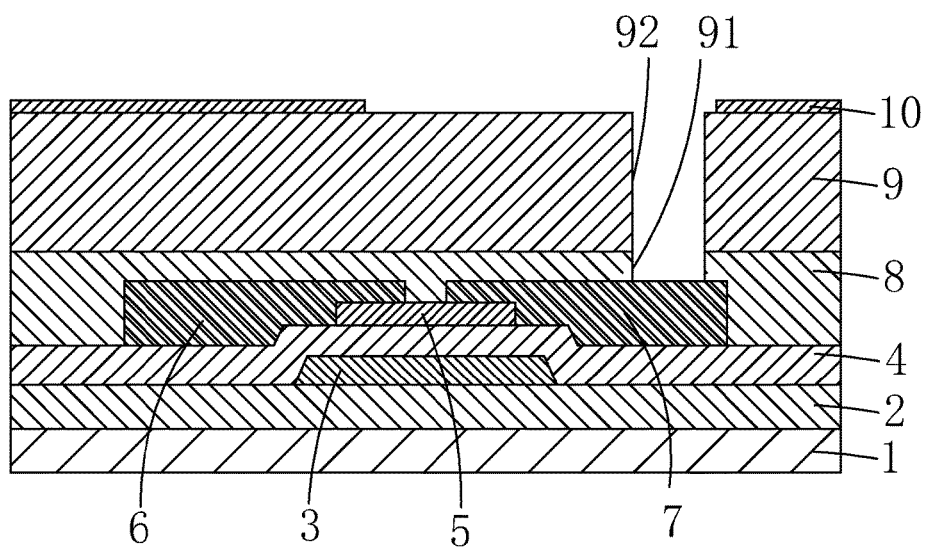
FIG. 18 is a schematic view illustrating a seventh step of the manufacturing method of the TFT substrate structure according to the present invention.

Step 7: as shown in FIG. 18, sequentially forming a first via 91 and a second via 92 in the first passivation layer 8 and the planarization layer 9 to be located above and correspond to the drain terminal 7, wherein the first via 91 and the second via 92 expose a portion of the drain terminal 7.

Specifically, a photolithographic process is first applied to the planarization layer 9 for exposure to form a first via 91 located above and corresponding to the drain terminal 7 and then, with the planarization layer 9 serving as a self-aligning mask, dry etching is applied to the first passivation layer 8 for etching to form a second via 92 corresponding to the first via 91.

Figure 19:
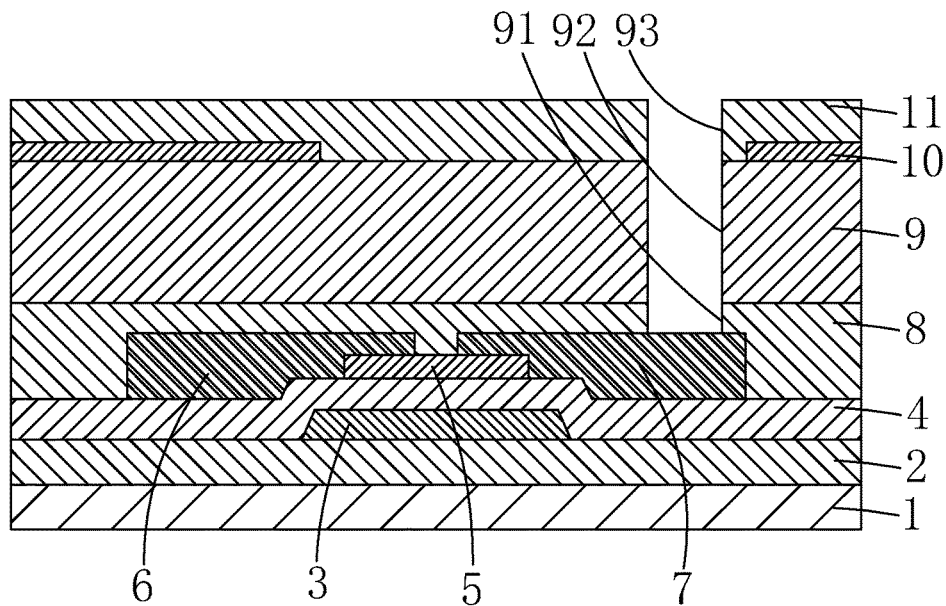
FIG. 19 is a schematic view illustrating an eighth step of the manufacturing method of the TFT substrate structure according to the present invention.

Step 8: as shown in FIG. 19, depositing a second passivation layer 11 on the first pixel electrode 10 and the planarization layer 9 and subjecting the second passivation layer 11 to patterning to form a third via 93 in the second passivation layer 11 to correspond to the first via 91 and the second via 92.

Preferably, the second passivation layer 11 comprises a material of silicon oxide, silicon nitride, or a stacked combination thereof.

Figure 20:
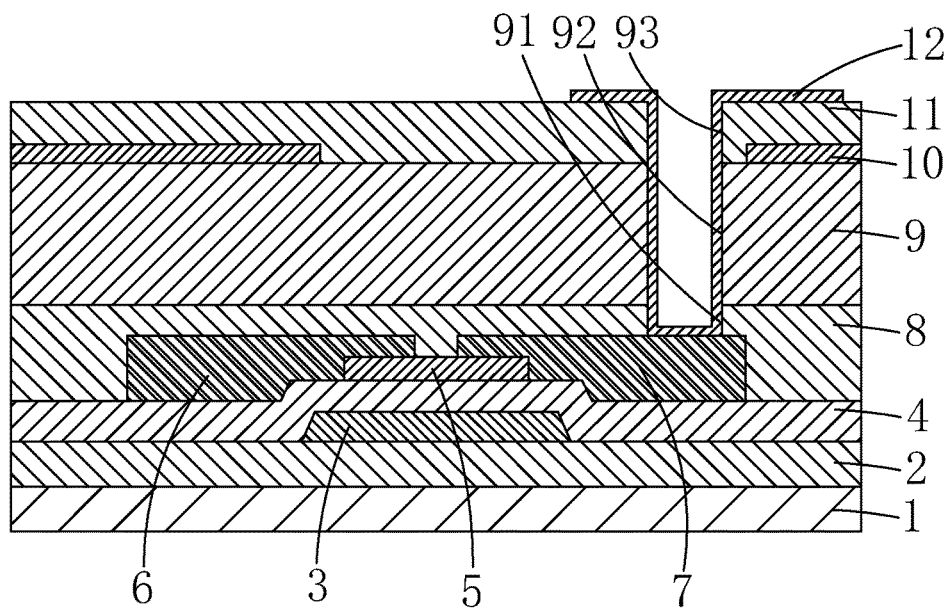
FIG. 20 is a schematic view illustrating a ninth step of the manufacturing method of the TFT substrate structure according to the present invention.

Step 9: as shown in FIG. 20, depositing a second transparent conductive film on the second passivation layer 11 and subjecting the second transparent conductive film to patterning to form a second pixel electrode 12, wherein the second pixel electrode 12 is connected, through the first, second, and third vias 91, 92, 93, to the drain terminal.

Preferably, the first pixel electrode 12 comprises a material of ITO.

In summary, the present invention provides a manufacturing method of a TFT substrate structure, which comprises sequentially forming a first passivation layer, a planarization layer, and a first transparent conductive film and then first subjecting the first transparent conductive film to patterning to form a first pixel electrode and thereafter, a photolithographic process is applied to the planarization layer for exposure and thus forming a first via located above and corresponding to a drain terminal, followed by using the planarization layer as a self-aligning mask to apply dry etching to the first passivation layer for etching to form a second via that corresponds to the first via, whereby residues of the first transparent conductive film in the first and second vias can be effectively prevented and product yield is enhanced. Further, on mask can be saved to prevent reduction of aperture ratio caused by misalignment thereby improving the production efficiency, reducing production cost, and increasing cost-related competition power of products.

Based on the description given above, those having ordinary skills of the art may easily contemplate various changes and modifications of the technical solution and technical ideas of the present invention and all these changes and modifications are considered within the protection scope of right for the present invention.

What is claimed is:

1. A manufacturing method of a thin-film transistor (TFT) substrate structure, comprising the following steps:
   (1) providing a base plate and depositing a buffer layer on the base plate and depositing a first metal layer on the buffer layer and subjecting the first metal layer to patterning to form a gate terminal;
   (2) depositing a gate insulation layer on the buffer layer and the gate terminal and depositing an oxide semiconductor on the gate insulation layer and subjecting the oxide semiconductor to patterning to form an island-like semiconductor layer;
   (3) depositing a second metal layer on the gate insulation layer and the island-like semiconductor layer and subjecting the second metal layer to patterning to form a source terminal and a drain terminal;
   (4) depositing a first passivation layer on the gate insulation layer, the island-like semiconductor layer, the source terminal, and the drain terminal;
   (5) forming a planarization layer on the first passivation layer;
   (6) depositing a first transparent conductive film on the planarization layer and subjecting the first transparent conductive film to patterning to form a first pixel electrode;
   (7) sequentially forming a first via and a second via in the first passivation layer and the planarization layer to be located above and correspond to the drain terminal, wherein the first via and the second via expose a portion of the drain terminal;
   (8) depositing a second passivation layer on the first pixel electrode and the planarization layer and subjecting the second passivation layer to patterning to form a third via in the second passivation layer to correspond to the first via and the second via; and
   (9) depositing a second transparent conductive film on the second passivation layer and subjecting the second transparent conductive film to patterning to form a second pixel electrode, wherein the second pixel electrode is connected, through the first, second, and third vias to the drain terminal.

2. The manufacturing method of the TFT substrate structure as claimed in claim 1, wherein the oxide semiconductor comprises a material of indium gallium zinc oxide (IGZO).

3. The manufacturing method of the TFT substrate structure as claimed in claim 1, wherein in step (4), chemical vapor deposition is adopted to deposit the first passivation layer.

4. The manufacturing method of the TFT substrate structure as claimed in claim 1, wherein in step (5), coating is adopted to form the planarization layer and the planarization layer is formed of perfluoroalkoxy alkane (PFA).

5. The manufacturing method of the TFT substrate structure as claimed in claim 1, wherein in step (6), physical vapor deposition is adopted to deposit the first transparent conductive film and wet etching is applied to form the first pixel electrode.

6. The manufacturing method of the TFT substrate structure as claimed in claim 1, wherein in step (7), a photolithographic process is first applied to the planarization layer for exposure to form a first via located above and corresponding to the drain terminal and then, with the planarization layer serving as a self-aligning mask, dry etching is applied to the first passivation layer for etching to form a second via corresponding to the first via.

7. The manufacturing method of the TFT substrate structure as claimed in claim 1, wherein the gate terminal comprises a material of one of molybdenum, titanium, aluminum, and copper or a stacked combination of multiple ones thereof.

8. The manufacturing method of the TFT substrate structure as claimed in claim 1, wherein the source terminal and the drain terminal comprise a material of one of molybdenum, titanium, aluminum, and copper or a stacked combination of multiple ones thereof.

9. The manufacturing method of the TFT substrate structure as claimed in claim 1, wherein the gate insulation layer, the first passivation layer, and the second passivation layer each comprise a material of silicon oxide, silicon nitride, or a stacked combination thereof.

10. The manufacturing method of the TFT substrate structure as claimed in claim 1, wherein the first pixel electrode and the second pixel electrode are formed of a material of indium tin oxide (ITO).

11. A manufacturing method of a thin-film transistor (TFT) substrate structure, comprising the following steps:
   (1) providing a base plate and depositing a buffer layer on the base plate and depositing a first metal layer on the buffer layer and subjecting the first metal layer to patterning to form a gate terminal;
   (2) depositing a gate insulation layer on the buffer layer and the gate terminal and depositing an oxide semiconductor on the gate insulation layer and subjecting the oxide semiconductor to patterning to form an island-like semiconductor layer;

(3) depositing a second metal layer on the gate insulation layer and the island-like semiconductor layer and subjecting the second metal layer to patterning to form a source terminal and a drain terminal;

(4) depositing a first passivation layer on the gate insulation layer, the island-like semiconductor layer, the source terminal, and the drain terminal;

(5) forming a planarization layer on the first passivation layer;

(6) depositing a first transparent conductive film on the planarization layer and subjecting the first transparent conductive film to patterning to form a first pixel electrode;

(7) sequentially forming a first via and a second via in the first passivation layer and the planarization layer to be located above and correspond to the drain terminal, wherein the first via and the second via expose a portion of the drain terminal;

(8) depositing a second passivation layer on the first pixel electrode and the planarization layer and subjecting the second passivation layer to patterning to form a third via in the second passivation layer to correspond to the first via and the second via; and (9) depositing a second transparent conductive film on the second passivation layer and subjecting the second transparent conductive film to patterning to form a second pixel electrode, wherein the second pixel electrode is connected, through the first, second, and third vias to the drain terminal;

wherein in step (4), chemical vapor deposition is adopted to deposit the first passivation layer;

wherein in step (5), coating is adopted to form the planarization layer and the planarization layer is formed of perfluoroalkoxy alkane (PFA);

wherein in step (6), physical vapor deposition is adopted to deposit the first transparent conductive film and wet etching is applied to form the first pixel electrode; and wherein in step (7), a photolithographic process is first applied to the planarization layer for exposure to form a first via located above and corresponding to the drain terminal and then, with the planarization layer serving as a self-aligning mask, dry etching is applied to the first passivation layer for etching to form a second via corresponding to the first via.

12. The manufacturing method of the TFT substrate structure as claimed in claim 11, wherein the oxide semiconductor comprises a material of indium gallium zinc oxide (IGZO).

13. The manufacturing method of the TFT substrate structure as claimed in claim 11, wherein the gate terminal comprises a material of one of molybdenum, titanium, aluminum, and copper or a stacked combination of multiple ones thereof.

14. The manufacturing method of the TFT substrate structure as claimed in claim 11, wherein the source terminal and the drain terminal comprise a material of one of molybdenum, titanium, aluminum, and copper or a stacked combination of multiple ones thereof.

15. The manufacturing method of the TFT substrate structure as claimed in claim 11, wherein the gate insulation layer, the first passivation layer, and the second passivation layer each comprise a material of silicon oxide, silicon nitride, or a stacked combination thereof.

16. The manufacturing method of the TFT substrate structure as claimed in claim 11, wherein the first pixel electrode and the second pixel electrode are formed of a material of indium tin oxide (ITO).

* * * * *